(12) United States Patent
Yao (10) Patent No.: US 10,686,084 B2
(45) Date of Patent: Jun. 16, 2020

(54) DIAMOND-BACKED PHOTODIODES, DIAMOND-SANDWICHED PHOTODIODES, PHOTODIODE SYSTEMS AND RELATED METHODS OF MANUFACTURE

(71) Applicant: Phase Sensitive Innovations, Inc., Newark, DE (US)

(72) Inventor: Peng Yao, Newark, DE (US)

(73) Assignee: Phase Sensitive Innovations, Inc., Newark, DE (US)

( * ) Notice: Subject to any disclaimer, the term of this patent is extended or adjusted under 35 U.S.C. 154(b) by 0 days.

(21) Appl. No.: 15/909,598

(22) Filed: Mar. 1, 2018

(65) Prior Publication Data

US 2018/0254356 A1 Sep. 6, 2018

Related U.S. Application Data

(60) Provisional application No. 62/465,179, filed on Mar. 1, 2017, provisional application No. 62/486,475, filed on Apr. 18, 2017.

(51) Int. Cl.

| | |
|---|---|
| *H01L 31/024* | (2014.01) |
| *H01L 27/144* | (2006.01) |
| *H01L 31/0304* | (2006.01) |
| *H01L 31/105* | (2006.01) |
| *H01L 31/18* | (2006.01) |
| *H01Q 3/26* | (2006.01) |
| *H01Q 21/06* | (2006.01) |
| *H01L 31/02* | (2006.01) |
| *H01L 23/373* | (2006.01) |

(52) U.S. Cl.
CPC ........ *H01L 31/024* (2013.01); *H01L 27/1446* (2013.01); *H01L 31/02005* (2013.01); *H01L 31/0304* (2013.01); *H01L 31/03046* (2013.01); *H01L 31/105* (2013.01); *H01L 31/1844* (2013.01); *H01Q 3/2676* (2013.01); *H01Q 21/062* (2013.01); *H01L 23/3732* (2013.01)

(58) Field of Classification Search
CPC .......................... H01L 31/024; H01L 27/1446
See application file for complete search history.

(56) References Cited

U.S. PATENT DOCUMENTS

| | | | |
|---|---|---|---|
| 2010/0052112 A1* | 3/2010 | Rogers | ............... B81B 7/0093 257/625 |
| 2011/0277813 A1 | 11/2011 | Rogers et al. | |
| 2012/0056212 A1 | 3/2012 | Huang et al. | |
| 2014/0145224 A1 | 5/2014 | Hsu et al. | |

FOREIGN PATENT DOCUMENTS

WO   2008/054846 A2   5/2006

OTHER PUBLICATIONS

Search Report and Written Opinion for International Application No. PCT/US18/20488 dated Jun. 19, 2018.

\* cited by examiner

*Primary Examiner* — Marc Anthony Armand
(74) *Attorney, Agent, or Firm* — Muir Patent Law, PLLC

(57) ABSTRACT

A photodiode device and method of manufacturing the same are disclosed. A stack of functional layers of the photodiode device, formed of crystalline semiconductor material, may be formed on a diamond substrate. The stack of functional layers may be in contact with or close proximity to the diamond substrate to thereby provide an efficient thermal conductive path between the functional layers and an external source, thereby mitigating problems that may result from overheating the photodiode device.

19 Claims, 6 Drawing Sheets

DIAMOND-BACKED PHOTODIODES, DIAMOND-SANDWICHED PHOTODIODES, PHOTODIODE SYSTEMS AND RELATED METHODS OF MANUFACTURE

CROSS-REFERENCE TO RELATED APPLICATION

This non-provisional application claims priority to U.S. Provisional Application No. 62/465,179, filed Mar. 1, 2017 and U.S. Provisional Application No. 62/486,475, filed Apr. 18, 2017, the contents of each of which being incorporated by reference in their entirety.

TECHNICAL FIELD

Example embodiments of the present disclosure relate to a novel photodiode and a novel method of manufacturing a photodiode.

RELATED ART

High power photodiode applications continue to be developed to and provide novel solutions to address various challenges. For example, antenna arrays being driven by high power photodiodes are being developed. However, to power various systems to a desired level, the power applied to a photodiode should be increased. For example, a light beam (e.g., laser light) may be modulated and used to drive a photodiode, with the photodiode converting the light to an RF electrical signal (e.g., to drive a corresponding RF antenna). However, heat is quickly generated by the photodiode in such an operation. Without efficient heat dissipation, problems associated with thermal failure or saturation due to over-heating may occur.

A conventional photodiode structure may include a diode structure formed from several functional semiconductor layers on a semiconductor substrate, such as InP (indium phosphide). However, as InP has a relatively low thermal conductivity (e.g., 68 W/mK), heat dissipation through the InP substrate is often insufficient for many applications.

One approach to assist in dissipating heat from a photodiode is to use a thermally conductive substrate to which the photodiode is flip-chip bonded. Heat generated by the photodiode may then be dissipated by providing a heat dissipation path through the anode/cathodes of the photodiode to conductive structure on the thermally conductive substrate. For example, "Improved power conversion efficiency in high-performance photodiodes by flip-chip bonding on diamond" by Xie et al. (Vol. 1, No. 6, Optica, December 2014) describes bonding a photodiode to a diamond submount to improve heat dissipation of the heat generated by the photodiode. However, although heat dissipation is improved with this approach, more efficient heat dissipation is still desired for many high-power photodiode applications to address problems associated with thermal failure or saturation due to over-heating.

SUMMARY

Disclosed herein are photodiode devices and methods of manufacturing the same. In some embodiments, a photodiode device comprises a first diamond layer, a first stack of functional semiconductor layers on the first diamond layer, the first stack of functional layers comprising an n-type semiconductor layer forming a cathode, a p-type semiconductor layer forming an anode disposed between the n-type semiconductor layer and the p-type semiconductor layer, the first stack of functional layers forming a first photodiode semiconductor structure, a first conductive metal connection contacting the n-type semiconductor layer, and a second conductive metal connection contacting the p-type semiconductor layer. The bottommost layer of the first stack of functional semiconductor layers may be in contact with or close to an upper surface of the first diamond layer. For example, the bottommost layer of the first stack of functional semiconductor layers may spaced apart from the upper surface of the first diamond layer by no more than 7 microns.

Methods of manufacturing photodiode devices are also disclosed. In some embodiments, a method of manufacturing a photodiode device, comprises forming a first photodiode semiconductor structure attached to an upper surface of a first diamond layer at a bottommost layer of the photodiode semiconductor structure, the bottommost layer of the first photodiode semiconductor structure and the upper surface of the first diamond layer being in contact or spaced apart by a small distance, such as being separated by no more than 7 microns. Forming the first photodiode semiconductor structure may include epitaxially growing a plurality of crystalline material layers, the plurality of crystalline material layers comprising an n-type semiconductor material layer, an intrinsic semiconductor material layer and a p-type semiconductor material layer and patterning the plurality of crystalline material layers to form the first photodiode semiconductor structure.

Other novel improvements disclosed herein may be appreciated from the following detailed disclosure.

BRIEF DESCRIPTION OF DRAWINGS

The above and other aspects and features are reflected in the exemplary embodiments set forth herein, with reference to the accompanying figures in which.

DETAILED DESCRIPTION

The present disclosure now will be described more fully hereinafter with reference to the accompanying drawings, in which various exemplary embodiments are shown. The invention may, however, be embodied in many different forms and should not be construed as limited to the exemplary embodiments set forth herein. These example exemplary embodiments are just that—examples—and many embodiments and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail—it is impracticable to list every possible variation for every feature described herein. The language of the claims should be referenced in determining the requirements of the invention.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present.

As used herein, components described as being "electrically connected" are configured such that an electrical signal can be transferred from one component to the other (although such electrical signal may be attenuated in strength as it transferred). Moreover, components that are "directly electrically connected" share a common electrical node through electrical connections by one or more conductors, such as, for example, wires, pads, internal electrical lines, through vias, etc. As such, directly electrically connected components do not include components electrically connected through active elements, such as transistors or diodes.

Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

Figure 1A:
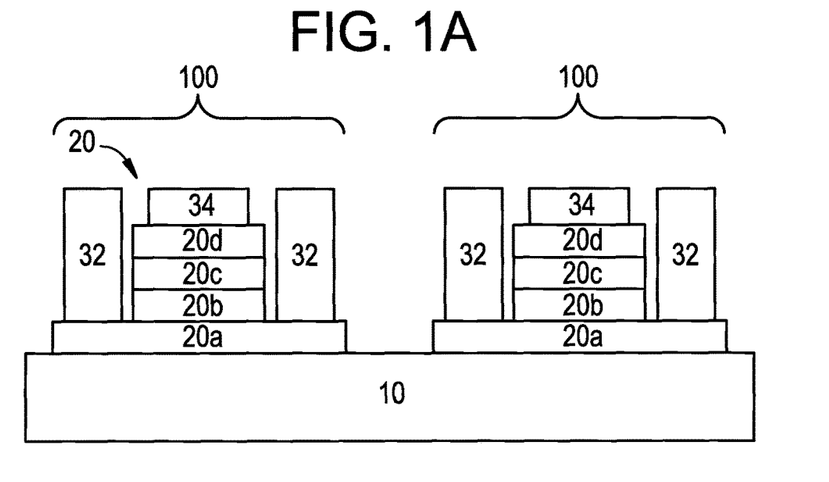
FIGS. 1A to 1H illustrate an exemplary process of manufacturing a photodiode according to an embodiment of the invention and resulting photodiode structures.

FIGS. 1A to 1G illustrate an exemplary process of manufacturing a photodiode according to an embodiment of the invention and the resulting photodiode. As shown in FIG. 1A, one or more photodiodes 100 may be provided. The photodiode 100 may be formed using conventional semiconductor manufacturing processes. For example, on a semiconductor substrate 10, a stack of doped semiconductor functional layers 20 may be epitaxially grown.

Semiconductor substrate 10 may be referred to as the photodiode substrate 10 in this disclosure. For example, substrate 10 may be a semi-insulating InP (SI InP) and may comprise a crystalline semiconductor InP (indium phosphide) wafer lightly doped, such as with a p-type (acceptor) impurity (e.g., Fe (iron) or Zn (zinc)) or with both n-type (donor) (e.g., Si (silicon) or Te (tellurium)) and p-type impurities.

The stack of semiconductor functional layers 20 may comprise an n+ InP layer 20a, an intrinsic InP layer 20b, an intrinsic InGaAs (Indium Gallium Arsenide) layer 20c and a p+ InGaAs layer 20d. The height of the stack 20 may be a few microns or less, such as 3 microns or less. As conventional, "n+" indicates the doping of a layer with n-type charge carrier impurities (donor type) and "p+" indicates the doping of a semiconductor material with p-type charge carrier impurities (acceptor type) (with the "+" indicating a relatively higher concentration). Thus, the stack of doped semiconductor functional layers 20 forms a photodiode semiconductor structure. The photodiode semiconductor structure formed by the stack of functional layers 20 extends from a cathode formed by n+ InP layer 20a to an anode formed by p+ InGaAs layer 20d. A depletion region is formed between the cathode and anode, and when exposed to light, a photon may generate an electron-hole pair to cause a photocurrent and voltage across the anode and cathode (in this example, 20a, 20d). The photodiode semiconductor structure may take many forms, including conventional PN, PIN, UTC, MUTC, etc. Each layer of the stack of semiconductor functional layers 20 may be epitaxially grown and may be a crystalline semiconductor layer. The p-type and n-type impurities may be formed in situ during the epitaxial growth of the impurity doped semiconductor layer (e.g., 20a or 20d) of the stack of functional layers 20. It will be appreciated that the stack of doped semiconductor functional layers 20 may include additional semiconductor layers in the stack of functional layers 20 and/or be formed with other types of semiconductor materials other than InP and InGaAs as described in this example.

The material layers of the stack of functional layers 20 (e.g., the material layers forming 20a, 20b, 20c and 20d) may be conformally formed across the entire semiconductor substrate 10 (e.g., across an entire wafer forming the semiconductor substrate 10) and the stack of functional layers 20 of the photodiode 100 may be formed by patterning the material layers (such as by selective etching using a photolithographically patterned photoresist as a mask) to expose the n+ InP layer 20a. It will be appreciated that other semiconductor materials may be used to form the stack of doped semiconductor functional layers 20 to form a photodiode semiconductor structure. It should also be understood that a photodiode semiconductor structure includes both the more conventional P-I-N photodiodes as well as photodiodes formed with a stack of p-type doped, intrinsic and n-type doped semiconductor layers. For example, a UTC (unitraveling carrier) photodiode and a MUTC (modified unitraveling carrier) photodiode are also considered P-I-N photodiodes in this application.

Then, for each photodiode 100, a cathode electrode 32 may be formed on the exposed n+ InP layer 20a and an anode electrode 34 may be formed on the p+ InGaAs layer 20d, e.g., using an electroplating process. The cathode electrode 32 and anode electrode 34 may each be formed of an electrically conductive metal that also has a relatively high thermal conductivity, such as Au (gold), Ag (silver), Cu (copper), Al (Aluminum) or allows thereof. The electrodes 32 and 34 may each be formed as a single continuous electrode or formed as several discrete, spaced apart sub-electrodes. For example, cathode electrode 32 may be formed to have a ring shape (from a top down perspective) to surround the stack of semiconductor functional layers 20. By forming the electrodes 32 and 34 to contact and cover a large area of the semiconductor layer of the stack 20 (here, the corresponding one of 20a and 20d), a larger thermal conductive path may be formed between the photodiode 100 and the diamond submount on which the photodiode 100 is later mounted in this example (as discussed below).

Although only two photodiodes 100 are shown as being formed in FIG. 1A, it will be appreciated that additional photodiodes 100 may be formed at the same time with the same processes on the same photodiode substrate 10 (e.g., on the same wafer substrate). The photodiodes 100 may be isolated from each other by isolating the stack of semiconductor functional layers 20, such as by separating semiconductor layer 20a into discrete "islands" (e.g., via selective etching using a patterned photoresist as a mask) on the photodiode substrate 10, each corresponding to a separate photodiode 100. The plurality of photodiodes 100 may be formed in a two-dimensional array across a wafer (e.g., across an SI InP wafer when SI InP is implemented as the photodiode substrate 10). For ease of explanation, the process will be described with respect to one photodiode 100, but it will be understood that the process and resulting structure applies equally to the simultaneous formation of a plurality of photodiodes 100.

Figure 1B:
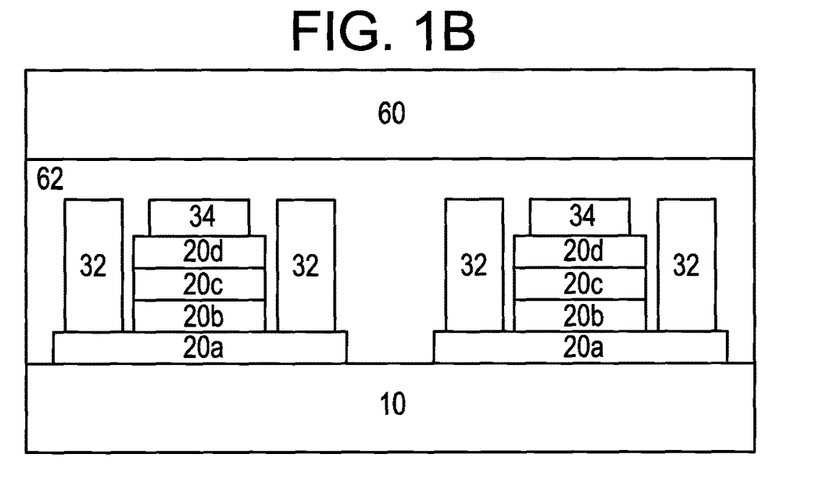

After forming one or more photodiodes 100, a carrier substrate 60 is attached to the active surface of the structure of FIG. 1A with an adhesive 62. As shown in FIG. 1B, the adhesive 62 contacts the stack of semiconductor functional layers 20, cathode electrode 32 and anode electrode 34 on one side and the carrier substrate 60 on the other side. The carrier substrate 60 may comprise a silicon wafer, e.g., or other substrate, preferably suitable for conventional semiconductor processing and handling.

Figure 1C:
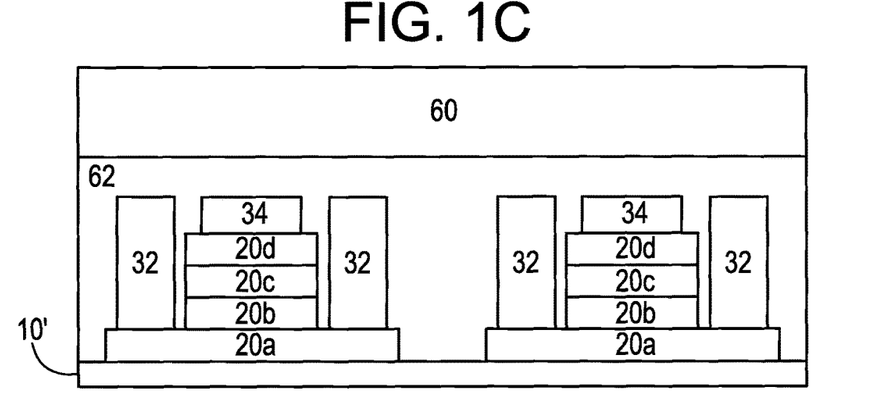

Then, as shown in FIG. 1C, at least part of the photodiode substrate 10 is removed to thin or completely remove the photodiode substrate 10. Specifically, all or some of the backside of the photodiode substrate 10 (opposite to the active surface of the structure of FIG. 1A) is removed, such as by grinding (e.g., lapping), etching (dry or wet etching), by a combination of grinding and etching (e.g., via chemical mechanical polishing (CMP)), etc. In FIG. 1C a portion of the photodiode substrate 10 remains after this thinning process (the portion denoted with reference numeral 10'). The thinned photodiode substrate 10' may have a thickness of several microns or less, such as 5 microns or less or 2 microns or less, e.g. The carrier substrate 60 may be used to hold the structure of FIG. 1B in place, such as by placing the carrier substrate 60 on a chuck of the CMP tool.

Alternatively, all of the photodiode substrate 10 may be removed during the thinning process while functional layers 20 remain after the thinning process. To facilitate removal of all of the photodiode substrate 10, prior to epitaxially growing functional layers 20 on the photodiode substrate 10 as described with respect to FIG. 1A, an etch-stop layer (not shown) may be formed on the photodiode substrate 10, and then the semiconductor functional layers 20 may be grown on the etch-stop layer (so that the etch stop layer is sandwiched between the photodiode substrate 10 and the semiconductor functional layers 20). The etch-stop layer may be epitaxially grown and be a crystalline semiconductor layer, such as crystalline InGaAs, InGaAsP or AlAs. Upon thinning the photodiode substrate 10 (e.g., backside grinding of the InP wafer, chemical mechanical polishing, dry or wet etching, lapping/polishing), the end of the thinning process may be determined upon detecting that the grinding/etching has reached the etch-stop layer. For example, during the thinning process, the residue material removed from the backside of the photodiode substrate 10 may be continually sampled to detect the material of the etch-stop layer (or any resulting compound due to chemical reactions with an etchant) and when the etch-stop layer is detected, the thinning process may be stopped. Although the remaining figures and description regarding this manufacturing process are described with respect to a thinned photodiode substrate 10' remaining after the thinning process, it will be appreciated that the process is equally applicable to a full removal of the photodiode substrate 10, with the resultant structure being equivalent (e.g., the same except with complete removal of photodiode substrate 10 and with the possible addition of an etch-stop layer as described herein).

Figure 1D:
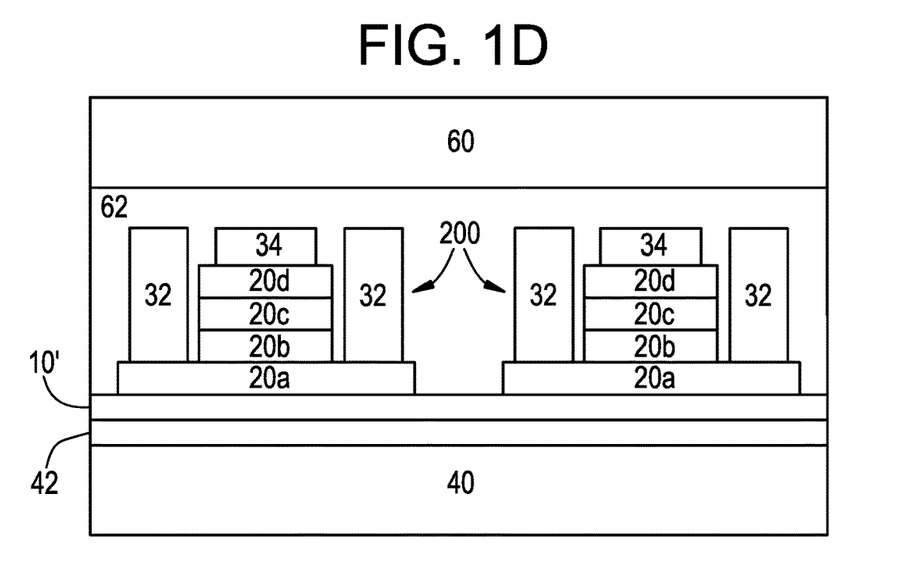

As shown in FIG. 1D, a diamond wafer 40 is attached with adhesive 42 to the backside of the photodiode structure resulting from the thinning process of FIG. 1C to provide a diamond backed photodiode 200. The adhesive 42 may be coated either to the diamond wafer 40 or to the surface of the backside of the FIG. 1C structure (e.g., to the thinned photodiode substrate 10', the etch-stop layer (not shown) or to the outermost one of the exposed functional layer, here semiconductor InP layer 20a). Then, the diamond wafer 40 may be joined and adhered to the functional layers 20 (with or without a thinned photodiode substrate 10'). Adhesive 42 may have a thickness less than two microns, such as less than a micron and may be transmissive to light (such as to infrared, visible and/or ultraviolet light), such as a transparent polymer material such as BCB (benzocyclobutene) or SU-8.

The diamond wafer 40 has a high thermal conductivity (~2000 W/mK or more) and replaces or substantially replaces the low-thermal conductivity InP substrate (68 W/mK). The thickness of the diamond wafer 40 may be made large (e.g., 200 microns or more, such as greater than 2 mm) to increase the heat transmission path capacity. In addition, the diamond material can transmit a large spectrum of light including infrared, visible and ultraviolet spectrums of light. Transmission of infrared light is particularly useful in order to allow transmission of light provided by readily available optic fibers (often transmitting infrared light of around 850, 1300 and 1550 nm). Thus, light may be transmitted through the diamond wafer 40 and impinge on the functional layers 20 which then convert the light to an electrical signal (providing a voltage output on the cathode electrode 32 and anode electrode 34).

The diamond wafer 40 is also advantageous to use with an RF (radio frequency) antenna and/or RF antenna array as the RF signals generated by the antenna(s) may be transmitted through the diamond wafer 40. The diamond wafer 40 avoids substantial interference with these RF signals.

Figure 1E:
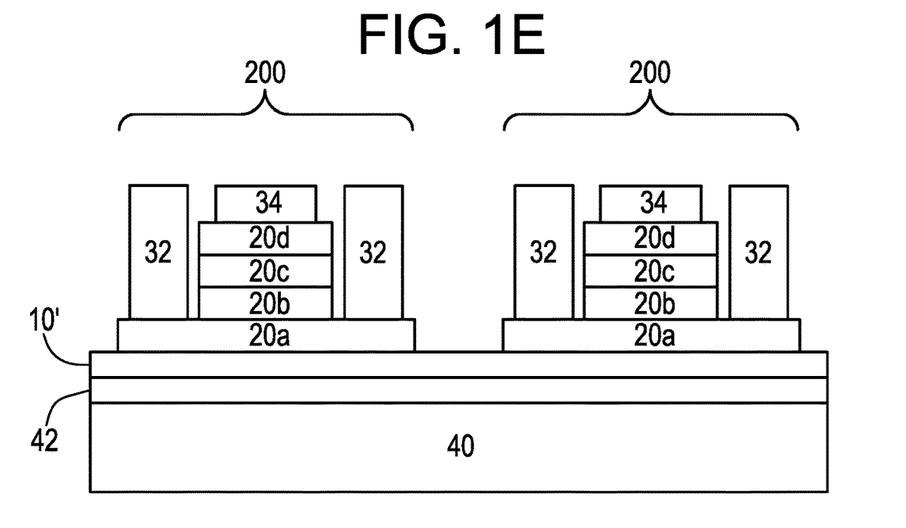

As shown in FIG. 1E, the carrier substrate 60 and adhesive 62 may be removed from the diamond backed photodiode 200, such as by detaching with physical force, using a suitable solvent to dissolve or weaken adhesive layer 62 or by applying heat or ultraviolet light to weaken the adhesive layer 62 and detaching by peeling the carrier substrate 60 away from the diamond backed photodiode 200.

Figure 1F:
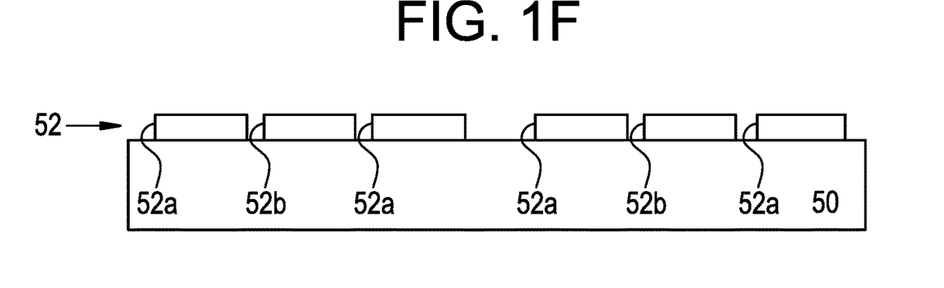

As shown in FIG. 1F, a diamond submount may be prepared. For example, the diamond submount may comprise a diamond wafer 50 having a metal pattern 52 formed at least one of its surfaces. The diamond wafer 50 may have any of the features described with respect to diamond wafer 40, including having a thickness of 200 microns or more, such as greater than 2 mm.

The metal pattern 52 may be formed by any suitable conductor, such as Au, Ag, Cu, Al, W, or alloys thereof. The metal pattern 52 may be formed per the design of the system in which the diamond backed photodiode 200 is to be used. For example, the metal pattern 52 may include elements 52a and 52b forming metal pads for respectively connecting to the cathode electrode 32 and anode electrode 34 of the diamond backed photodiode 200. Discrete wiring may also comprise portions of the metal pattern 52 to transmit electrical signals received from the diamond backed photodiode 200 to an appropriate source. In some examples, the metal pattern 52 may include antennas, such as dipole antennas or patch antennas. See, for example, U.S. Provisional Application No. 62/465,181 filed Mar. 1, 2017 and U.S. patent application Ser. No. 15/242,459 filed Aug. 19, 2016 both of which are incorporated by reference in their entirety, teaching various antennas and antenna arrays that are driven and/or controlled by photodiodes, their operation, as well as exemplary physical and structural relationships between the antennas, photodiodes and optical feeds (e.g., optical waveguides) to the photodiodes. In some examples, elements 52*a* and 52*b* may form portions of an antenna (e.g., radiating arms of a dipole antenna). In some examples, the antennas may be formed of an additional metal pattern (not shown) on the opposite side of the diamond wafer 50 (external side of diamond wafer 50 away from the diamond backed photodiode 200) and be connected to the electrical RF signals provided by the diamond backed photodiode 200 via pads 52*a*, 52*b* and wiring (e.g., through vias in the diamond backed photodiode 200—not shown) or RF waveguides (e.g., microstrip—not shown). Additional layers may be provided to facilitate the design of the desired system, such as dielectric layers on one or both sides of the diamond wafer 50 and additional layers of patterned metal. In some examples, antennas described herein may be formed of such an additional metal pattern on one of these additional dielectric layers.

The metal pattern 52 may be formed by electroplating, by a damascene process or by etching a metal layer deposited on the surface of the diamond wafer 50. In the electroplating process, a thin conductive seed layer may be deposited across the surface of the diamond wafer, an insulating layer may then be formed on the seed layer and patterned to form openings in the insulating layer exposing the seed layer. Then, the structure may be subjected to electroplating by depositing the diamond wafer 50 in an electroplating bath to deposit metal of the bath into the openings of within the insulating layer (by applying a voltage to the conductive seed layer, the portions of the seed layer exposed by the openings of the insulating layer will attract and have attached metal suspended in the bath). The patterned insulating layer may then be removed and an etch may be performed to remove the exposed seed layer on which patterned insulating layer had covered, leaving the electroplated metal as the metal pattern 52. The metal pattern 52 may also be formed with a damascene process which may comprise depositing metal over and within openings of a patterned insulating layer formed on the diamond wafer 50, planarizing the metal to expose the upper surface of the patterned insulating layer and removing the insulating layer to leave the metal in the openings as the metal pattern 52. The metal pattern 52 may also be formed by directly patterning a metal layer deposited on the surface of the diamond wafer 50 (e.g., by selectively etching using a patterned photoresist formed over the metal layer as a mask).

Figure 1G:
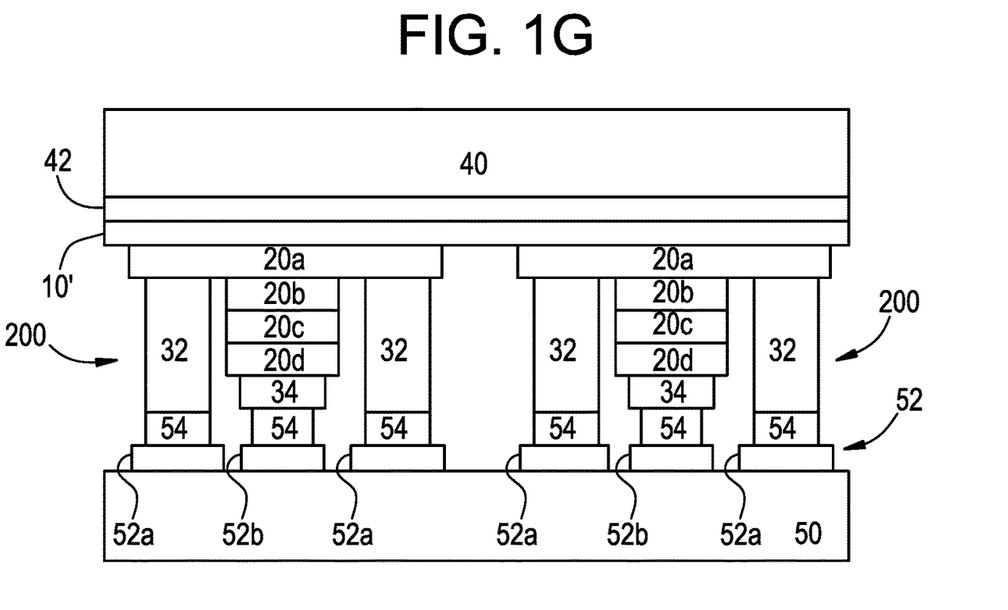

As shown in FIG. 1G, the diamond backed photodiodes 200 may be mounted on the diamond submount by connecting the cathode electrode(s) 32 to the pad(s) 52*a* and the anode electrode(s) 34 to pad(s) 52*b*. As described with respect to the cathode and anode electrodes 32, 34, the pads 52*a* and 52*b* may have a variety of configurations. For example, in the cross-sectional view of FIG. 1G, pad metal 52*a* may be part of a large continuous portion of the metal pattern 52 or may be discretely formed pads (relatively larger areas of metal with respect to a top down view) connected by wiring of the metal pattern 52 (relatively smaller width as compared to the pad area dimensions).

Figure 1H:
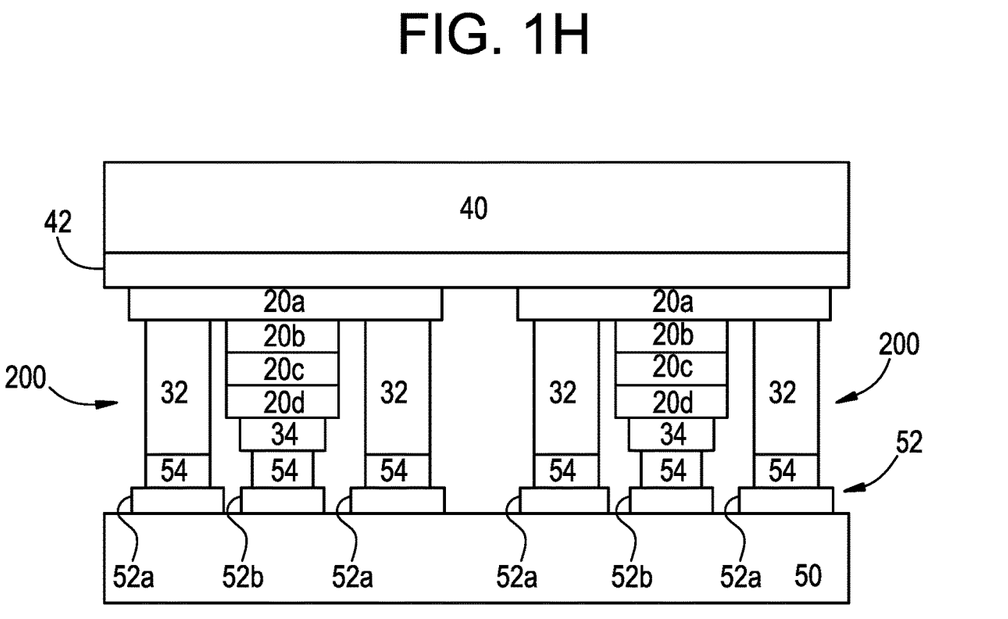

In some examples, the metal pattern 52 or an additional metal pattern 52 may form antennas at a location other than that shown in FIGS. 1G and 1H. For example, antennas (to which corresponding diamond backed photodiodes 200 are electrically connected) may be formed on a substrate or other layer on which the stack of functional layers are formed, such as on thinned photodiode substrate 10', or on the upper or lower surface of diamond wafer 40, or on the lower surface of diamond wafer 50. U.S. non-provisional patent application Ser. No. 15/909,798 filed Mar. 1, 2018, entitled "TWO-DIMENSIONAL CONFORMAL OPTICALLY-FED PHASED ARRAY AND METHODS OF MANUFACTURING THE SAME" by Shouyuan Shi, Dennis Prather, Peng Yao and Janusz Murakowski (a Non-Provisional of U.S. Provisional Application No. 62/465,181, filed on Mar. 1, 2017, U.S. Provisional Patent Application No. 62/590,066, filed Nov. 22, 2017) is incorporated by reference for providing further exemplary details of various alternative antenna and photodiode formation and their arrangements, as well as alternative interconnections with between antenna-photodiode pairs, as well as use of different antenna types and the use of a signal feed module (which may include a plurality of optical waveguides integrally formed therein or include a plurality of RF waveguides integrally formed therein), such as with diamond wafer 40 or 50. This concurrently filed application is also incorporated by reference for exemplary details of an antenna array and an antenna array module, with which the embodiments described herein may implemented at a system level.

Mounting the diamond backed photodiodes 200 to the diamond submount (50, 52) may be performed with conventional flip chip mounting techniques. For example, conductive bumps 54 may be placed on pads 52*a*, 52*b* and the diamond backed photodiode by be placed to have the cathode electrode 32 and anode electrode 34 contact the conductive bumps 54 (e.g., gold bumps such as gold balls). A metal reflow process may be performed to heat the conductive bumps 54, causing at least part of the bumps 54 to melt and merge with metal of the corresponding cathode electrode 32, anode electrode 34 and pads 52*a*, 52*b*. Upon cooling, such merged conductive material may form a vertically extending conductive metal connection (e.g., a conductive metal pillar) which provides a direct electrical and physical connection between the stack of functional layers 20 and diamond submount (e.g., to radiating arms of dipole antennas or wiring formed by the patterned metal on the diamond submount). It should be appreciated that the metal connections between the stack of functional layers 20 and the diamond submount (50, 52) may be implemented in a variety of ways. For example, although the above description indicates formation of an anode electrode 34 on the stack of functional layers 20, such anode electrode 34 may be omitted and a conductive bump 54 may contact the functional layers 20 to connect the functional layers 20 to the diamond submount and the electrical components thereon (e.g., antennas and/or wiring as described herein).

In addition, it should be appreciated that connecting the diamond submount (50, 52) to the diamond backed photodiode 200 may be done at the wafer level. For example, a two-dimensional array of diamond backed photodiodes 200 (arrayed on the same diamond wafer 40) may be connected to the same diamond submount (e.g., patterned metal 52 on the same diamond wafer 50) to thereby simultaneously mount and connect a plurality of diamond backed photodiodes 200 to the diamond submount (50, 52). For example, a two-dimensional array of diamond backed photodiodes 200 may be connected to a two-dimensional array of antennas, such as dipole antennas or patch antennas, formed on the diamond submount, where each of the antennas has a location on the diamond submount (50, 52) corresponding to one of the diamond backed photodiodes, creating a plurality of diamond backed photodiode-antenna pairs. Alternatively, mounting of each diamond backed photodiode 200 may be performed individually by separating the diamond backed photodiodes 200 from one another (e.g., through a laser cutting process) and then attaching each diamond backed photodiode 200 to the diamond submount (50, 52).

While the figures illustrate a relatively close spacing of neighboring diamond backed photodiodes 200, in some implementations the diamond backed photodiodes 200 may be spaced apart from neighboring photodiodes 200 by a significant distance. For example, spacing between neighboring photodiodes 200 (e.g., arranged in a two-dimensional array on the thin photodiode substrate 10') may have be at least five times or more than the width of the photodiode 200 (width referring to the maximum width, which in this embodiment may correspond to the width of functional layer 20a). For example, with respect to the vertical cross-sectional view of FIGS. 1G and 1H, the distance between neighboring photodiodes 200 may be more than 10 times W, where W is the width of functional layer 20a). Providing such additional spacing may be helpful to reduce the effects of heat generated from neighboring photodiodes 200.

The length of the conductive connections (e.g., cathode electrode 32, conductive bump 54 and any wiring formed by patterned metal 52 to connect to the antenna radiating arm, or similar conductive connection to connect to the anode) may be made less than one half the wavelength of the RF electromagnetic signal (e.g., corresponding to the RF carrier frequency) to be emitted by the antenna radiating arm, avoiding the use of an RF waveguide and baluns. The length of the antenna radiating arm may be one half the wavelength of this RF electromagnetic signal (e.g., corresponding to the RF carrier frequency). However, it should be appreciated that other electrical connections between the diamond backed photodiode 200 and corresponding electrical structure may be used, which may not involve use of the diamond submount (50, 52) (i.e., the diamond submount (50, 52) is optional and may be avoided altogether in some implementations).

FIG. 1H illustrates the resulting structure according to the process of this embodiment when thinning the photodiode substrate 10 as described with respect to FIG. 1C results in full removal of the photodiode substrate 10.

As will be appreciated, providing a layer of diamond in contact with or spaced apart by a small distance from the functional layers 20 of the photodiode provides a significant thermal transfer path from the functional layers 20 of the photodiode to an external source. For example, the spacing between the surface of the diamond substrate 40 and the opposing surface of functional layer 20a may be seven microns or less (e.g., separated by a 2 micron thick (or less) adhesive layer 42 and a five micron thick (or less) thinned photodiode substrate 10'). However, such separation may be made smaller, such as three microns or less, when using a thinner adhesive layer 42 (e.g., 1 micron or less), a thinner photodiode substrate 10' (e.g., 2 microns or less) and/or fully removing the photodiode substrate 10 during the thinning process.

Figure 2A:
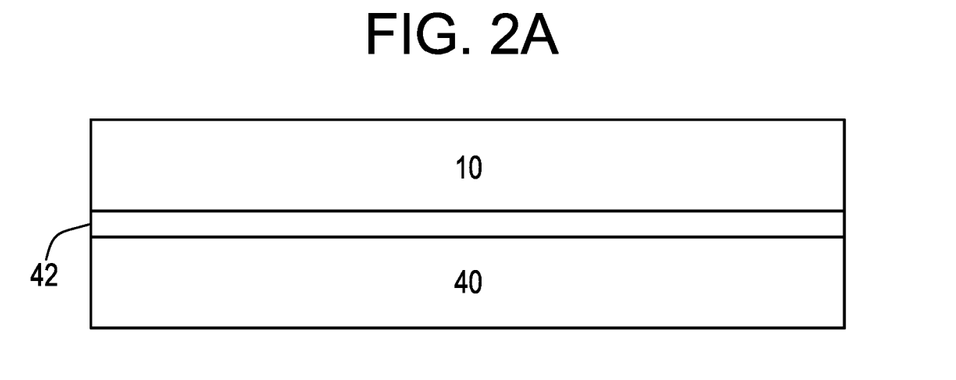
FIGS. 2A to 2C illustrate an alternative process for forming a diamond backed photodiode and a diamond sandwiched photodiode.
Figure 2B:
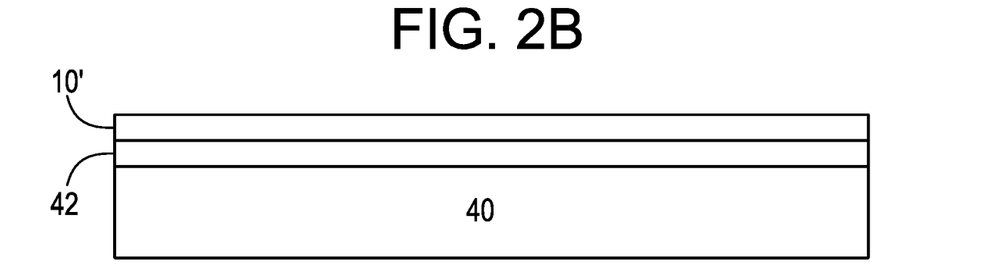
Figure 2C:
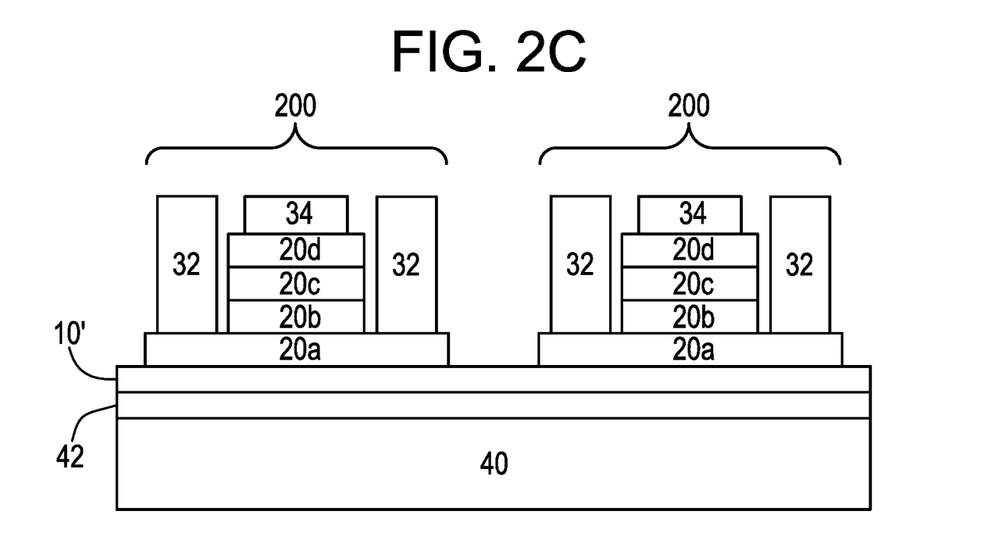

FIGS. 2A to 2C illustrate an alternative process for forming a diamond backed photodiode and a diamond sandwiched photodiode. Processes and structure that may be the same as that described with respect to FIGS. 1A to 1G may be omitted for brevity. In FIG. 2A, a photodiode substrate 10 (e.g., SI InP) is bonded to a diamond wafer via adhesive 42. Then, as shown in FIG. 2B, the photodiode substrate 10 is thinned by etching, grinding, CMP, etc. forming a thinned photodiode substrate 10' (e.g., having a thickness of 5 microns or less, such as 2 microns or less. On the exposed surface of the thinned photodiode substrate 10', the stack of functional layers 20 are formed and patterned, and cathode electrodes 32 and anode electrodes 34 are formed as described herein with respect to FIG. 1A, resulting in the formation of a plurality of diamond backed photodiodes 200 as shown in FIG. 2C. The remaining steps may be the same as that described with respect to FIGS. 1F and 1G to obtain a plurality of diamond sandwiched photodiodes.

Figure 3A:
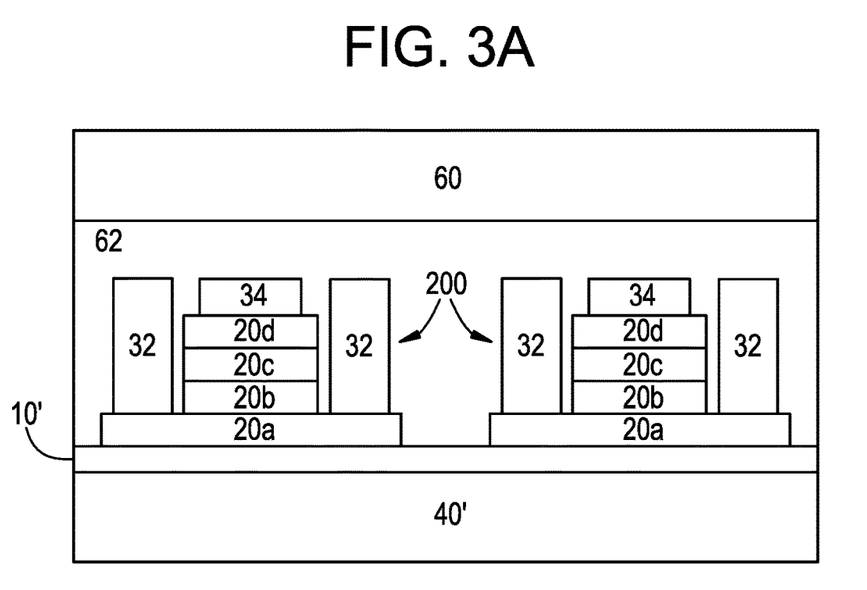
FIGS. 3A and 3B show details representing an alternative process to that disclosed with respect to the embodiment of FIGS. 1A to 1H.

FIGS. 3A and 3B show details representing an alternative process to that disclosed with respect to the embodiment of FIGS. 1A to 1H. In this alternative embodiment, the diamond formed on the backside surface of the thinned photodiode substrate 10' may be epitaxially grown, rather than attaching a diamond wafer with an adhesive. The process steps described with respect to FIGS. 1A to 1C may be the same in this alternative embodiment. However, after thinning the photodiode substrate 10 to obtain the thinned photodiode substrate 10' as described with respect to FIG. 1C, the exposed thinned photodiode substrate 10' may have an epitaxial diamond layer 40' formed thereon (i.e., by epitaxially growing diamond layer 40' on the photodiode substrate 10') (as shown in FIG. 3A). In some examples, it may be beneficial to first epitaxially grow a strain buffer layer (not shown) of a crystalline semiconductor material having a lattice constant intermediate to the lattice constants of the crystalline thinned photodiode substrate 10' and the epitaxial diamond layer 40' (e.g., the crystalline buffer layer may have a lattice constant between SI InP and diamond) to interpose a strain buffer layer between the crystalline thinned photodiode substrate 10' and the diamond layer 40'. Such a strain buffer layer may be the same as strain buffer layer 22 described with respect to FIGS. 4A and 4B, but it will be appreciated that the order of formation of the relevant portions of the buffer layer 22 should be reversed when the strain buffer layer is formed with a graded lattice constant or with sub-layers having different lattice constants as described below.

The epitaxial diamond layer 40' may be grown to an appropriate thickness to facilitate heat transfer from the diamond backed photodiode 200 to an external source, such as a metal heat sink attached to the diamond backed photodiode. For example, the epitaxial layer 40' may be grown to be greater than 200 microns, such as 2 mm or more. When the diamond layer 40' is grown on a strain buffer layer that is formed on the thinned photodiode substrate 10', it may be grown in the same epitaxial process as growing the strain buffer layer (e.g., in situ in the same process chamber without vacuum break of the chamber pressure or removal of the photodiode structure).

Figure 3B:
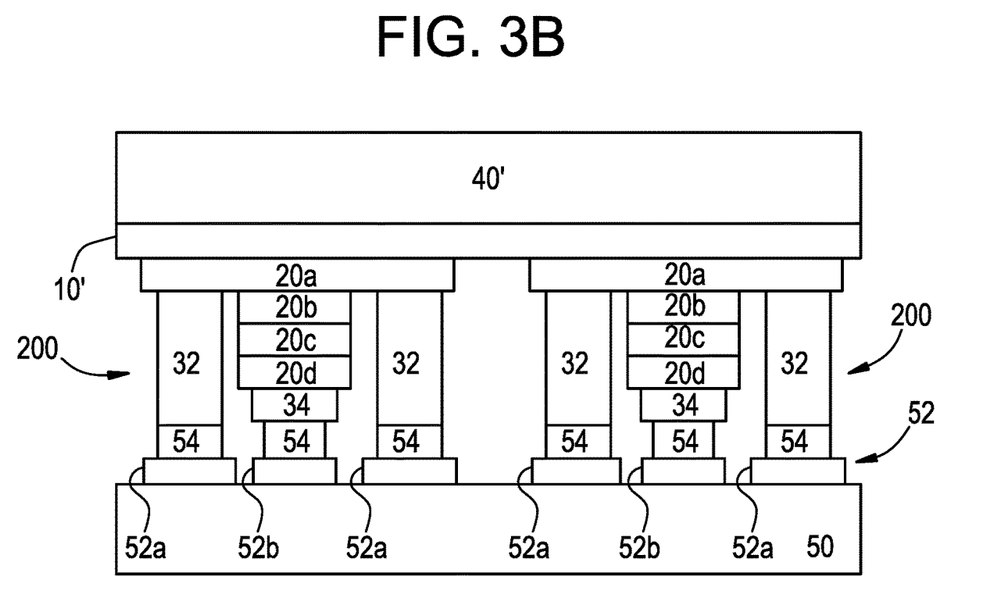

After growing the epitaxial diamond layer 40', the steps may be the same as that described with respect to FIGS. 1E to 1G, resulting in the structure shown in FIG. 3B.

Figure 4A:
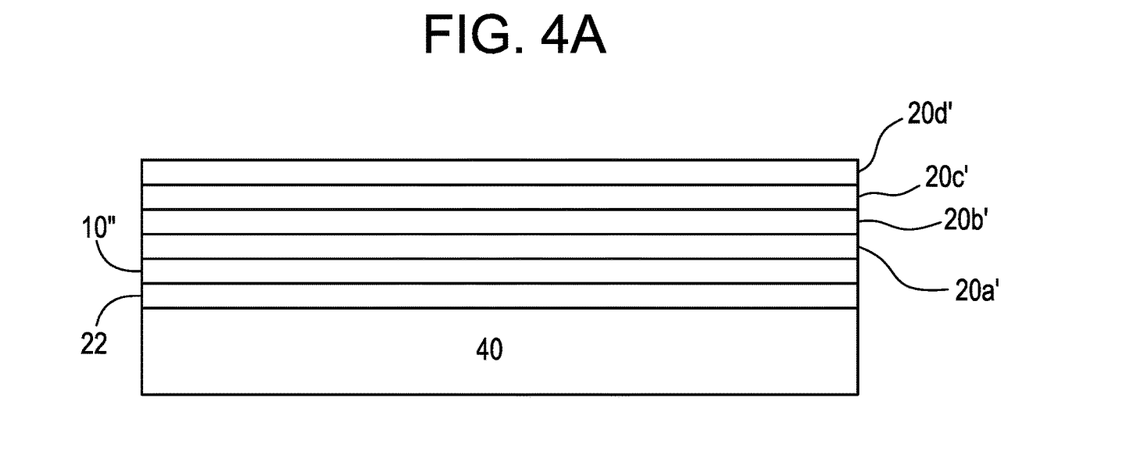
FIGS. 4A and 4B illustrate an alternative embodiment in which a diamond backed photodiode 200 is formed by epitaxially growing the stack of functional layers on a diamond substrate.
Figure 4B:
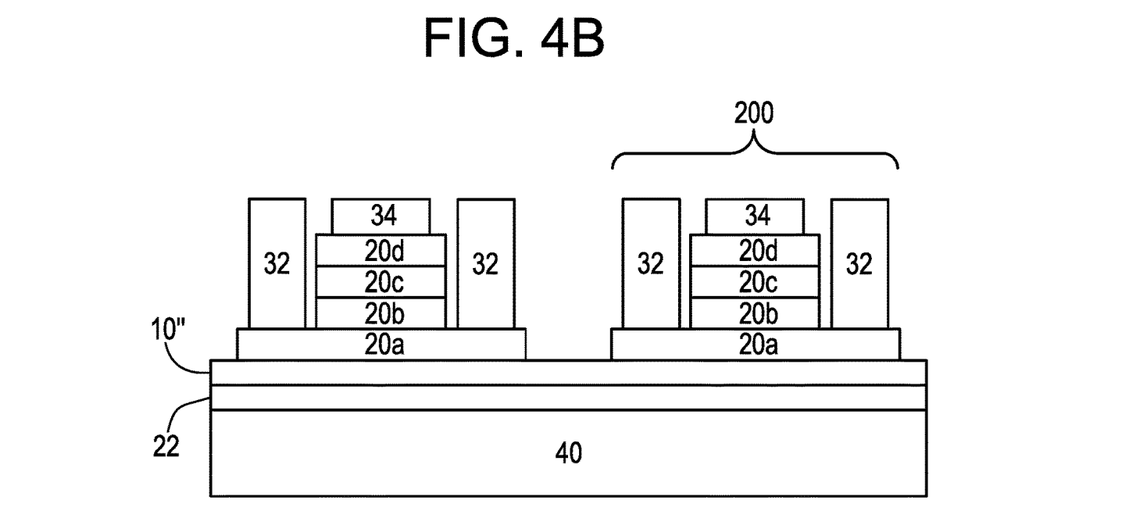

FIGS. 4A and 4B illustrate an alternative embodiment in which a diamond backed photodiode 200 is formed by epitaxially growing the stack of functional layers forming the photodiode semiconductor structure on a diamond substrate. In this example, diamond substrate 40 is used as a seed layer on which to grow several epitaxial layers. As shown in FIG. 4A, diamond substrate 40 may have formed there on a strain buffer layer 22, a thin photodiode substrate 10" and a stack of crystalline semiconductor material layers $20a'$, $20b'$, $20c'$ and $20d'$ (when patterned form a stack of the semiconductor functional layers 20). The strain buffer layer 22, the thin photodiode substrate 10" and each layer $20a'$, 20b', 20c' and 20d' of the stack of semiconductor functional layers 20 may be epitaxially grown in sequential order on the diamond substrate 40, each being formed as a crystalline material. The material of the thin photodiode substrate 10" and the semiconductor functional layers 20 may be the same as described herein and may have additional layers formed in the stack of functional layers 20, as described herein. It will be appreciated that the thin photodiode substrate 10" and strain buffer layer 22 may be made very thin when epitaxially grown on the diamond substrate 40. The total distance between the stack of semiconductor functional layers 20 and the surface of the diamond substrate may be less than 200 nm, for example.

The crystalline structure of the strain buffer layer 22 may have a lattice constant intermediate to the lattice constants of the crystalline thin photodiode substrate 10" and the diamond substrate 40 (e.g., the crystalline buffer layer may have a lattice constant between SI InP and diamond). For example, when the thin photodiode substrate 10" is a conventional semiconductor substrate (such as InP or InGaAs), the thin photodiode substrate 10" may have a crystalline lattice constant of about 5.85 (e.g., 5.85+/−5% as InGaAs lattice constant may range from about 6.05 to about 5.65 depending on the selected relative concentrations of the atomic elements of In, Ga and As). The lattice constant of the thermally conductive crystalline diamond substrate 40 may be 3.567. Thus, the strain buffer layer 22 be formed of a crystalline material having a lattice constant between 3.6 and about 5.8. In addition, the strain buffer layer 22 may be formed as several crystalline layers (e.g., sub-layers) that are sequentially grown in situ, with each subsequent crystalline strain sub-layer grown being formed of a crystalline material having a lattice constant greater than the layer on which it was grown (e.g., an increasing lattice constant of the sub-layers of the strain buffer layer 22 in a direction away from the diamond substrate 40 to the photodiode substrate 10").

For example, the epitaxial strain buffer layer 22 may be formed of silicon carbide (SiC) where sub-layers closer to diamond substrate 40 are formed with a relatively lower percentage of Si and a higher percentage of C as compared to those sub-layers further away from the diamond substrate 40 and closer to the photodiode substrate 10". In some examples, the epitaxial growth may continuously change a precursor gas supply to continuously increase the lattice constant of the strain buffer layer crystalline material as it is epitaxially grown (e.g., continuously increase a ratio of Si precursor gas to C precursor gas supplied to a CVD chamber that performs the epitaxial growth of the strain buffer layer 22). The photodiode substrate 10" may be epitaxially grown in the same chamber as the process of growing the epitaxial strain layer and may be performed in situ (e.g., without a vacuum break).

The stack of crystalline semiconductor material layers 20a', 20b', 20c' and 20d' may be patterned forming a stack of functional layers 20 (e.g., 20a, 20b, 20c and 20d) for each formed photodiode 200 as described herein (e.g., with respect to FIG. 1A) and cathode electrodes 32 and anode electrodes 34 may be added as described herein to obtain the diamond backed photodiodes 200 as shown in FIG. 4B. If desired, further processes may be performed, such as those described with respect to FIGS. 1F and 1G.

In the embodiments described herein, diamond has been implemented as the thermally conductive layer (e.g., substrate 40 or epitaxial layer 40') in connection with the details of the process and device embodiments. However, other materials may be used rather than diamond. Similarly, other materials may be used for a strain buffer layer. The material of the thermally conductive layer may be selected based on its thermal conductivity and its transparency to the light that the photodiode is configured to generate a photocurrent (e.g., a voltage output on its anode and cathode electrodes) upon exposure to such light. The following materials may be alternative options for one or both of the thermally conductive substrates and the strain buffer layer:

Silicon carbide (SiC) 3c, 4h, 6h—this may be preferable when the photodiode senses ultraviolet light as certain SiC is transparent to ultraviolet light.

Silicon carbide (SiC) in the form of moissanite—this may be preferable when the photodiode senses visible or infrared light.

Graphene

Cubic boron arsenide

The thermal conductivity of such thermally conductive layers may be greater than 350 W/mK (Watts per meter per Kelvin), and greater than 500 W/mK and preferably greater than 1000@/mK.

It should be appreciated that the materials referenced herein with respect to the described strain buffer layers and alternatives for replacing the thermally conductive diamond substrates/submounts are described as crystalline, it is possible for such crystalline materials to include crystalline defects which may, in some circumstances, result in separate crystal formation in the crystalline substrates and strained buffer layers. However, it will be appreciated that "crystalline" as used herein is not intended to reference polycrystalline or amorphous materials, although such materials may also be implemented with the embodiments described herein.

In some examples, it may be possible to use a photodiode substrate of diamond, graphene, boron arsenide, SiC, e.g., that are appropriately doped to form the photodiode semiconductor structure (either by implanting of appropriate p dopants or n dopants to form the p doped and/or n doped semiconductor layers of the photodiode semiconductor structure, or by in-situ doping during epitaxial growth of these layers). In this case, the photodiode substrate need not be thinned but may embody the features of both the photodiode substrate and the thermally conductive substrate described herein. The submount (substrate) may be flip-chip bonded to the photodiode electrodes formed on this thermally conductive substrate as described herein.

It is emphasized that the descriptions herein are exemplary and deviations from which will be recognized to fall within the scope of the invention as set forth in the claims of this application.

What is claimed is:

1. A photodiode device comprising:
   a first diamond layer;
   a first stack of semiconductor functional layers on the first diamond layer, the first stack of semiconductor functional layers comprising an n-type semiconductor layer forming a cathode and a p-type semiconductor layer forming an anode, the first stack of semiconductor functional layers forming a first photodiode semiconductor structure;
   a first conductive metal connection contacting the n-type semiconductor layer; and
   a second conductive metal connection contacting the p-type semiconductor layer,
   wherein the bottommost layer of the first stack of semiconductor functional layers is in contact with or is separated from an upper surface of the first diamond layer by no more than 7 microns.

2. The photodiode device of claim 1, further comprising:
a photodiode substrate on which the first stack of semiconductor functional layers is formed; and
an adhesive connecting the photodiode substrate to the first diamond layer,
wherein the adhesive is transmissive to light.

3. The photodiode device of claim 2, wherein the adhesive is transmissive to infrared light.

4. The photodiode device of claim 2, wherein the adhesive is one of BCB (benzocyclobutene) or SU-8.

5. The photodiode device of claim 2, wherein the photodiode substrate has a thickness of 5 microns or less.

6. The photodiode device of claim 5, wherein the photodiode substrate is a layer of semi-insulative indium phosphide (InP).

7. The photodiode device of claim 6, wherein n-type semiconductor layer of the first stack of semiconductor functional layers is an epitaxial InP layer doped with n-type impurities and contacts the photodiode substrate.

8. The photodiode device of claim 5, further comprising a plurality of stacks of semiconductor functional layers including the first stack of semiconductor functional layers,
wherein the plurality of stacks of semiconductor functional layers are spaced apart from one another and formed on the photodiode substrate, and each of the plurality of stacks of semiconductor functional layers forming a corresponding photodiode semiconductor structure to form a plurality of photodiode semiconductor structures on the photodiode substrate, and
wherein the photodiode substrate is an intrinsic semiconductor crystalline substrate.

9. The photodiode device of claim 8 wherein the plurality of photodiode semiconductor structures are arranged in a two-dimensional array on the photodiode substrate.

10. The photodiode device of claim 9, wherein the first photodiode semiconductor structure is spaced apart from each of immediate neighboring ones of the plurality of photodiode semiconductor structures by a distance no less than 10 times the maximum width first photodiode semiconductor structure.

11. The photodiode device of claim 1, further comprising:
an adhesive contacting and adhering the first photodiode semiconductor structure to the first diamond layer,
wherein the adhesive is transmissive to light.

12. The photodiode device of claim 1, further comprising:
a photodiode substrate having a first surface on and contacting a surface of the first diamond layer and having a second surface, opposite to the first surface, on which the first stack of semiconductor functional layers is formed.

13. The photodiode device of claim 1, further comprising:
a buffer crystalline layer having a first surface on and contacting a surface of the first diamond layer and having a second surface, opposite to its first surface; and
a photodiode substrate having a first surface on and contacting the second surface of the buffer crystalline layer and having a second surface, opposite to its first surface, on which the first stack of semiconductor functional layers is formed,
wherein the buffer crystalline layer comprises a crystalline material having a lattice constant between a lattice constant of the first diamond layer and a lattice constant of the photodiode substrate.

14. The photodiode device of claim 1, further comprising:
a second diamond layer;
a conductive metal pattern on a first surface of the second diamond layer in contact with the first conductive metal connection and the second conductive metal connection, and
wherein the first photodiode semiconductor structure is located between the first diamond layer and the second diamond layer.

15. The photodiode device of claim 14,
wherein the first conductive metal connection is electrically connected to a first radiating arm of a first dipole antenna,
wherein the second conductive metal connection is electrically connected to a second radiating arm of the first dipole antenna, and
wherein the first and second radiating arms of the first dipole antenna are elements of the conductive metal pattern.

16. The photodiode device of claim 15, wherein the first and second conductive metal connection comprise conductive metal pillars extending between the first diamond layer and the second diamond layer.

17. The photodiode device of claim 16, further comprising:
a plurality of stacks of semiconductor functional layers including the first stack of functional semiconductor layers, wherein the plurality of stacks of semiconductor functional layers are spaced apart from one another on the first diamond layer, and each of the plurality of stacks of semiconductor functional layers forming a corresponding photodiode semiconductor structure to form a plurality of photodiode semiconductor structures on the first diamond layer; and
a plurality of dipole antennas, including the first dipole antenna, each of the plurality of dipole antennas formed on the second diamond layer and being connected to a corresponding one of the photodiode semiconductor structures.

18. The photodiode device of claim 17, further comprising a photodiode substrate formed of intrinsic semiconductor crystalline material on which the plurality of stacks of semiconductor functional layers are formed.

19. The photodiode device of claim 18, wherein the photodiode substrate has a thickness of 5 microns or less.

* * * * *